(12) United States Patent
Johansson

(10) Patent No.: US 7,760,019 B2
(45) Date of Patent: Jul. 20, 2010

(54) ADAPTIVE OPERATIONAL TRANSCONDUCTANCE AMPLIFIER LOAD COMPENSATION

(75) Inventor: Robert Johansson, Oslo (NO)

(73) Assignee: Micron Technology, Inc., Boise, ID (US)

( * ) Notice: Subject to any disclaimer, the term of this patent is extended or adjusted under 35 U.S.C. 154(b) by 211 days.

(21) Appl. No.: 12/041,766

(22) Filed: Mar. 4, 2008

(65) Prior Publication Data
US 2009/0224829 A1  Sep. 10, 2009

(51) Int. Cl.
*H03F 3/45* (2006.01)
(52) U.S. Cl. .............. 330/252; 330/305; 330/124 R
(58) Field of Classification Search ............. 330/252, 330/305, 124 R
See application file for complete search history.

(56) References Cited

U.S. PATENT DOCUMENTS

| | | | |
|---|---|---|---|
| 5,338,977 | A | 8/1994 | Carobolante |
| 5,541,555 | A | 7/1996 | Pernici |
| 5,867,778 | A * | 2/1999 | Khoury et al. ............ 455/321 |
| 6,518,737 | B1 | 2/2003 | Stanescu et al. |
| 6,657,498 | B2 * | 12/2003 | Park et al. ................ 330/285 |
| 6,885,331 | B2 | 4/2005 | Krymski |
| 7,075,470 | B2 | 7/2006 | Lee |
| 7,091,785 | B2 | 8/2006 | Deval et al. |
| 7,202,733 | B1 | 4/2007 | Aram et al. |
| 7,282,685 | B2 * | 10/2007 | Boemler ................ 250/208.1 |
| 7,292,098 | B2 | 11/2007 | Chen et al. |
| 7,389,087 | B2 * | 6/2008 | Darabi et al. ............. 455/20 |
| 7,486,135 | B2 * | 2/2009 | Mu ........................... 330/51 |
| 7,570,116 | B2 * | 8/2009 | Haila et al. ................ 330/264 |
| 7,643,573 | B2 * | 1/2010 | Kejariwal et al. ......... 375/297 |
| 2002/0122129 | A1 * | 9/2002 | Lee .......................... 348/308 |
| 2006/0055383 | A1 | 3/2006 | Eberlein | |

FOREIGN PATENT DOCUMENTS

EP 0 446 652 A1 9/1991

OTHER PUBLICATIONS

Xuguang Zhang et al., A Novel Low-Voltage Operational Transconductance Amplifier and Its Applications, ISCAS 2000 = IEEE International Symposium on Circuits and Systems, May 28-31, 2000, Geneva, Switzerland.
Byungsub Kim, et al., Power-Adaptive Operational Amplfier With Positive-Feedback Self Biasing, Department of Electrical Engineering and Computer Science Massachusetts Institute of Technology, Cambridge, USA.
Bhupendra K. Ahuja, An Improved Frequency Compensation Technique for CMOS Operational Amplifiers, IEEE Journal of Solid-State Circuit, vol. SC-18, No. 6, Dec. 1983.
Ludwig G.A. Callewaert et al, Class AB CMOS Amplifiers With High Efficiency, IEEE Journal of Solid-State Circuits, vol. 25, No. 3 Jun. 1990.

* cited by examiner

*Primary Examiner*—Patricia Nguyen
(74) *Attorney, Agent, or Firm*—RatnerPrestia

(57) ABSTRACT

A buffer varies the size of its output stage in response to a varying capacitive load. The capacitive load may vary in a predictable or a random manner. The buffer includes an operational amplifier having an output stage of multiple transistors, selectively connected in parallel. During operation, data regarding the size of the capacitive load is obtained and used to determine the size of the output stage. In general, as the capacitive load increases, the number of transistors connected in parallel at the output stage also increases.

8 Claims, 13 Drawing Sheets

ADAPTIVE OPERATIONAL TRANSCONDUCTANCE AMPLIFIER LOAD COMPENSATION

FIELD OF THE INVENTION

This invention relates, generally, to capacitive load compensation. More specifically, this invention relates to load compensation of an operational transconductance amplifier (OTA) when the capacitive load at the amplifier output varies in either predictable or random manner.

BACKGROUND OF THE INVENTION

In some systems, a capacitive load may vary greatly. In general, the capacitive load may vary over time in a predictable or random manner. A voltage source which is referred to ground is typically utilized to supply a constant reference voltage to the varying capacitive load. As the capacitive load varies, the charge required by the voltage source will vary. Due to a high impedance output, the voltage source is current limited, and therefore cannot sink or source large amounts of charge in short periods of time. This current sinking limitation may cause a drop in the desired reference voltage across the capacitive load, which may yield undesired system behavior.

One method of combating this current limitation is the use of a buffer. Generally, the buffer has voltage feedback which lowers the output impedance and provides unity gain. This feedback configuration is capable of outputting a large amount of current when required. When the required capacitive charge varies, the buffer is able to supply sufficient current to the capacitors, whereas an un-buffered voltage source could not. The response of the buffer is an important concern, particularly because feedback may cause instability. In general, as the charge required of the capacitive load varies and the output of the buffer is driven away from the reference voltage, the output of the buffer should return to the reference voltage quickly without excessive ringing or overshooting. To obtain a stable response without ringing or overshooting, the buffer should have a phase margin that is sufficient for all charge conditions.

The present invention provides an improved load compensation system. Furthermore, as described below, the invention provides compensation to loads that vary in either a predictable or a random manner.

DETAILED DESCRIPTION OF THE INVENTION

As will be described, the present invention provides an adaptive load compensation system for a varying load of capacitors, which are selectively coupled in parallel to a node. The present invention includes a buffer having multiple transistors selectively coupled in parallel to the same node, wherein the number of transistors selectively coupled to the node depends on the number of capacitors selectively coupled to the node. In general, the number of transistors connected to the node increases with the number of capacitors connected to the node.

Figure 1:
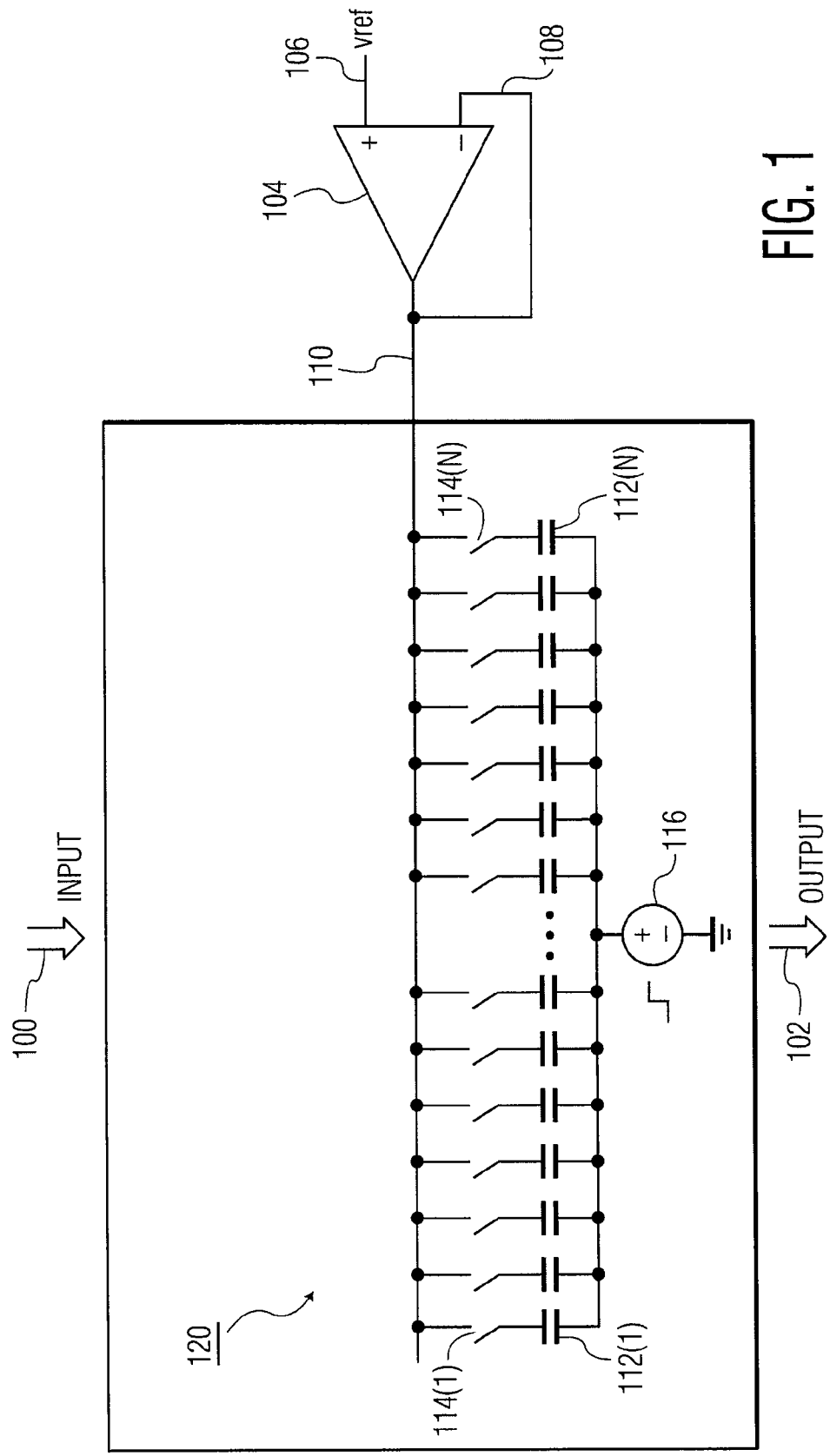
FIG. 1 is a schematic diagram of a buffer supplying voltage to a variable capacitive load.

Referring first to FIG. 1, there is shown a variable capacitive load designated as 120, including capacitors 112(1)-112(N) and switches 114(1)-114(N). In general, closing one of the switches increases the capacitive load between input terminal 100 and output terminal 102, whereas opening one of the switches decreases the capacitive load.

Each of the capacitors of the load is connected in parallel to common node 110. One end of each capacitor has an electrical potential responsive to voltage source 116. The other end of each capacitor has an electrical potential responsive to common node 110 of buffer 104. Buffer 104 has an input reference voltage Vref applied to positive terminal 106 and an output voltage at common node 110 applied to negative terminal 108. As will be appreciated, such a configuration, results in buffer 104 behaving as a voltage follower.

It will be understood that buffer 104 is configured to have a unity gain. Accordingly, input voltage Vref is translated almost directly to output node 110 without amplification or attenuation. As capacitive load 120 varies during operation, buffer 104 maintains an approximately constant voltage Vref at output node 110, by adaptively varying the output current to match the capacitive load requirement.

Figure 2:
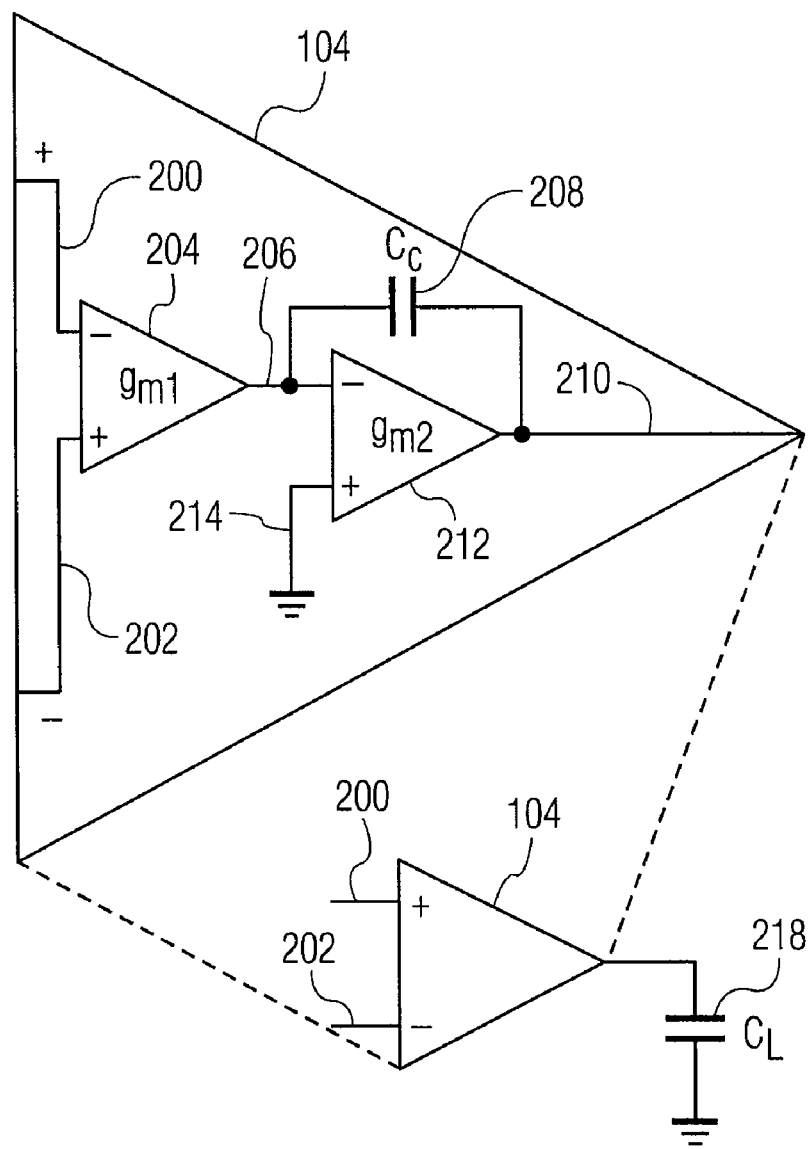
FIG. 2 is a schematic diagram of a two stage buffer including a Miller compensation capacitor for stability.

One embodiment of buffer 104 includes the two stages of gain as shown in FIG. 2. The first stage includes high gain amplifier 204 having input terminals 200, 202 and output node 206. The second stage includes current amplifier 212 having a grounded first input node 214, and compensation capacitor 208 coupled between second input node 206 and output node 210. Stability of buffer 104 may be obtained by Miller compensation. In general, the values of compensation capacitor 208 (Cc) and transconductance of amplifier 204 (gm1) are used to calculate the gain-bandwidth (GBW), as follows:

$$GBW = \frac{g_{m1}}{C_c} \text{ radians/second}$$

The values of capacitive load 218 ($C_L$) and the transconductance of amplifier 212 (gm2) are then used to determine the second pole ($\omega_2$) of buffer 104 as follows:

$$\omega_2 = \frac{g_{m2}}{C_c}$$

In order to obtain settling with minimal overshooting for buffer 104, the ratio of the second pole ($\omega_2$) to GBW preferably should be greater than or equal to three (3). The calculation is as follows:

$$\frac{\omega_2}{GBW} \geq 3$$

Miller compensation capacitor 208 maintains settling, however, it also consumes a large amount of area on a chip, as well as a large amount of power. In addition, the Miller compensation capacitor transfers an attenuated version of the power supply noise to output 210 via output stage amplifier 212. Therefore, Miller compensation is not a preferred solution. In general, buffer 104 with Miller compensation as shown in FIG. 2 is designed to be stable for a maximum capacitive load. As the capacitive load increases, however, the buffer becomes less stable.

Buffer 104 can alternatively be designed with a single stage amplifier that utilizes the capacitive load to obtain stability. Specifically, the single stage amplifier is designed to be stable for a specified minimum capacitive load and to obtain settling time for a specified maximum capacitive load. Accordingly, it may be difficult for the system to achieve both stability and settling time, when the capacitive load varies by a large amount.

Figure 3:
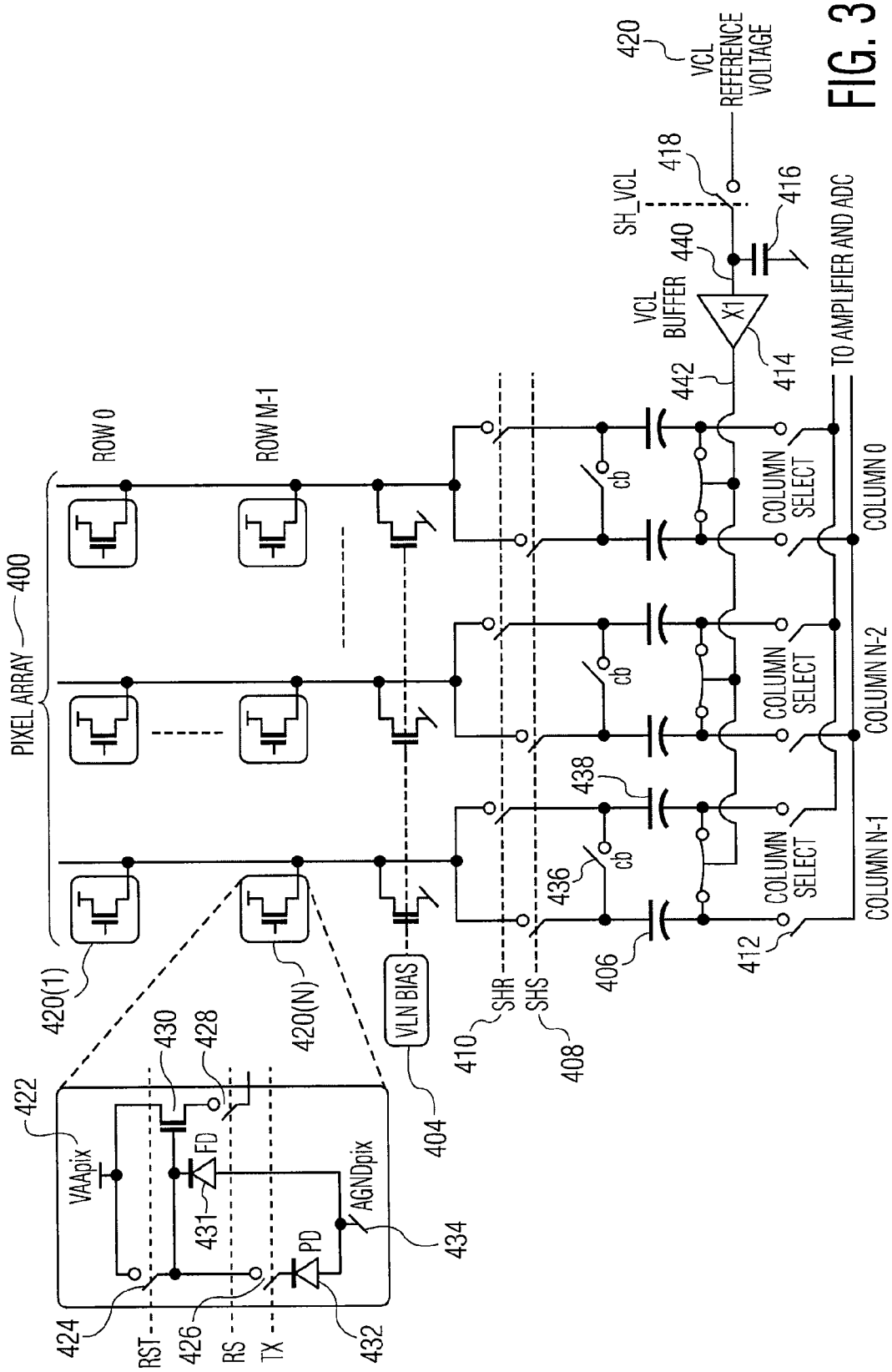
FIG. 3 is a schematic diagram of a pixel array for capturing an image, including parallel columns of sampling capacitors.

An example of a system subjected to a large variation in its capacitive load is an imager circuit. A first example of an imager circuit is a buffer driving the back plates of a multiple column capacitors during a pixel readout as shown in FIG. 3. As shown, pixel array 400 includes multiple rows and columns of pixels. Each column in the array includes pixels 402(1)-402(N). Photodiode 432 and floating diffusion 431 may be reset via RST switch 424 and TX switches 426. During an integration time, impinging photons generate electron hole pairs which are collected at the cathode of photo diode 432. After integration, a readout procedure is performed. Specifically, floating diffusion 431 is reset with voltage reference Vaapix via RST switch 424. Next, the reset voltage is sampled by capacitor 406. Then, RST 424 is turned off and TX 426 is turned on which converts the charge of floating diffusion 431 to a voltage that is read out and stored in capacitor 438. The voltage difference between capacitors 406 and 438 is proportional to the collected charge amount. The effective capacitance Ceff of the floating diffusion is determined by the capacitance of photo-diode 432, parasitic capacitance, and gate-source capacitance Cgs of source follower 430. Shown below is the effect of the gate-source capacitance Cgs and amplifier gain A on capacitance Ceff:

$$Ceff = Cgs(1-A)$$

During read out, the gate-source capacitance Cgs of source follower 430 acts as a Miller capacitance. The gate source capacitance Cgs, does not significantly contribute to the effective capacitance Ceff, because gain A of source follower 430 is typically set between 0.8 and 0.9. By setting gain A of the amplifier close to unity, the above equation tends to zero.

During the sampling of a row of pixels, SHR 410 and SHS 409 are asserted. During this sampling time, the back plates of capacitors 406 and 438 are set to reference voltage 420 via SH_VCL switch 418, capacitor 416 and unity gain buffer 414. When the pixel difference is read out and converted by an ADC, however, reference voltage 420 is not connected to the back plates of capacitors 406 and 438. Noise contained in the reference voltage is sampled and filtered by SH_VCL switch 418 and capacitor 416 before SHR and SHS. Furthermore, any voltage component of the resulting buffer output 422 that is the same at the end of SHR and SHS is removed by a correlated double sampling procedure.

In general, the back plate voltage supplied by buffer 414 is known as the common mode voltage which is utilized during both sampling and readout. By maintaining a common mode voltage larger than ground, the risk for minority carrier injection is reduced. Another benefit to a common mode voltage larger than ground is that the shift between sampling and readout is smaller. If the shift is large, a parasitic mismatch will translate part of the common mode voltage shift into an undesired differential signal.

Figure 5:
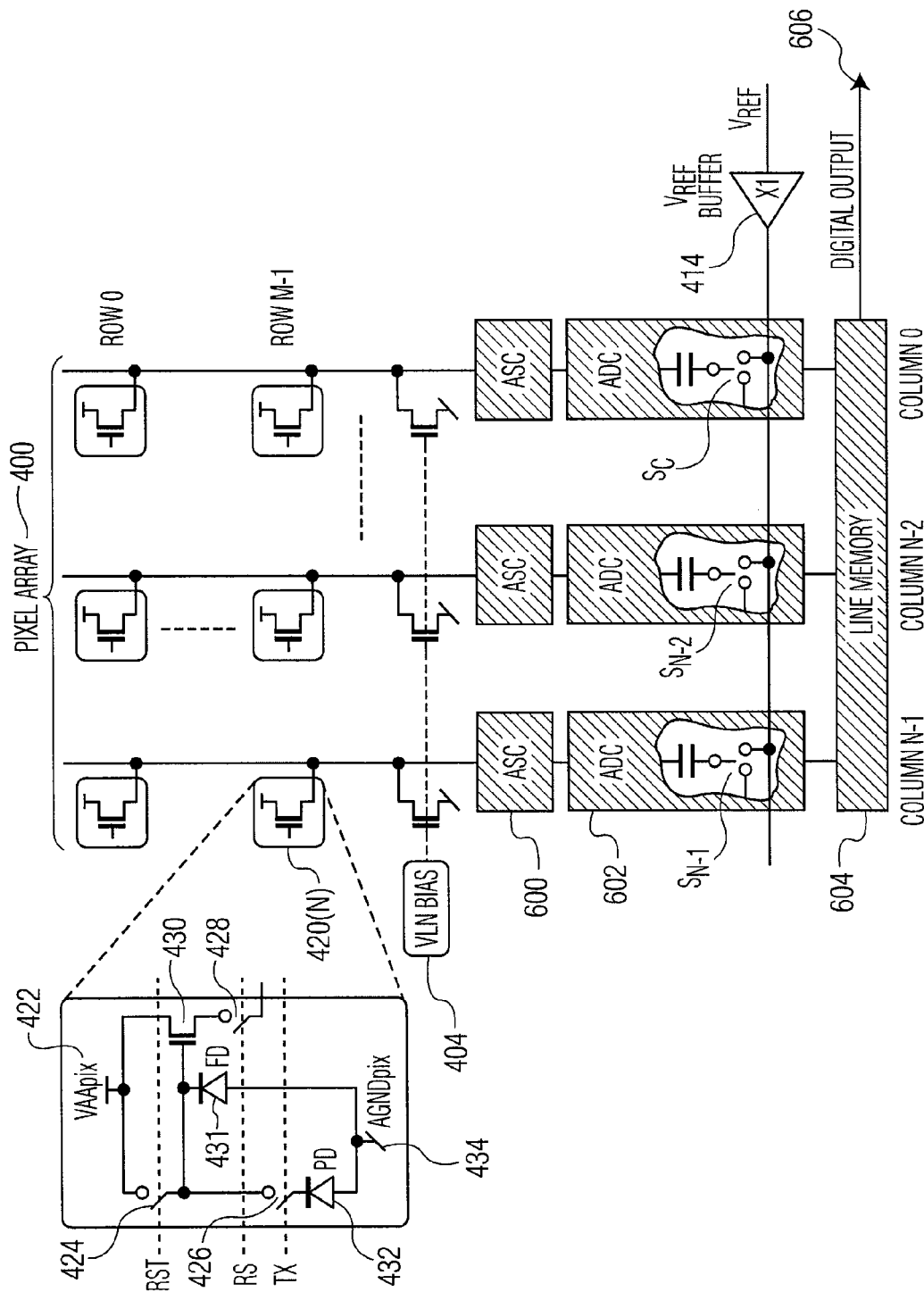
FIG. 5 is a schematic diagram of a pixel array for capturing an image, including parallel columns of programmable gain amplifiers (PGAs) also referred to as analog signal chains (ASC) and analog-to-digital converters (ADCs).

A second example of an imager circuit is the column parallel signal chain shown in FIG. 5. As shown, a row of pixels is amplified by programmable gain amplifier (PGA) 600 and converted into a digital format by ADC 602. The ADC 602 then passes the converted digital signal to line memory 604, where it may be stored and passed to digital output line 606. Similar to the first example, the second example shown in FIG. 5 includes buffer 414 which applies a reference voltage Vref to ADC 602. It will be appreciated that the reference voltage is subjected to a varying capacitive load.

Figure 4:
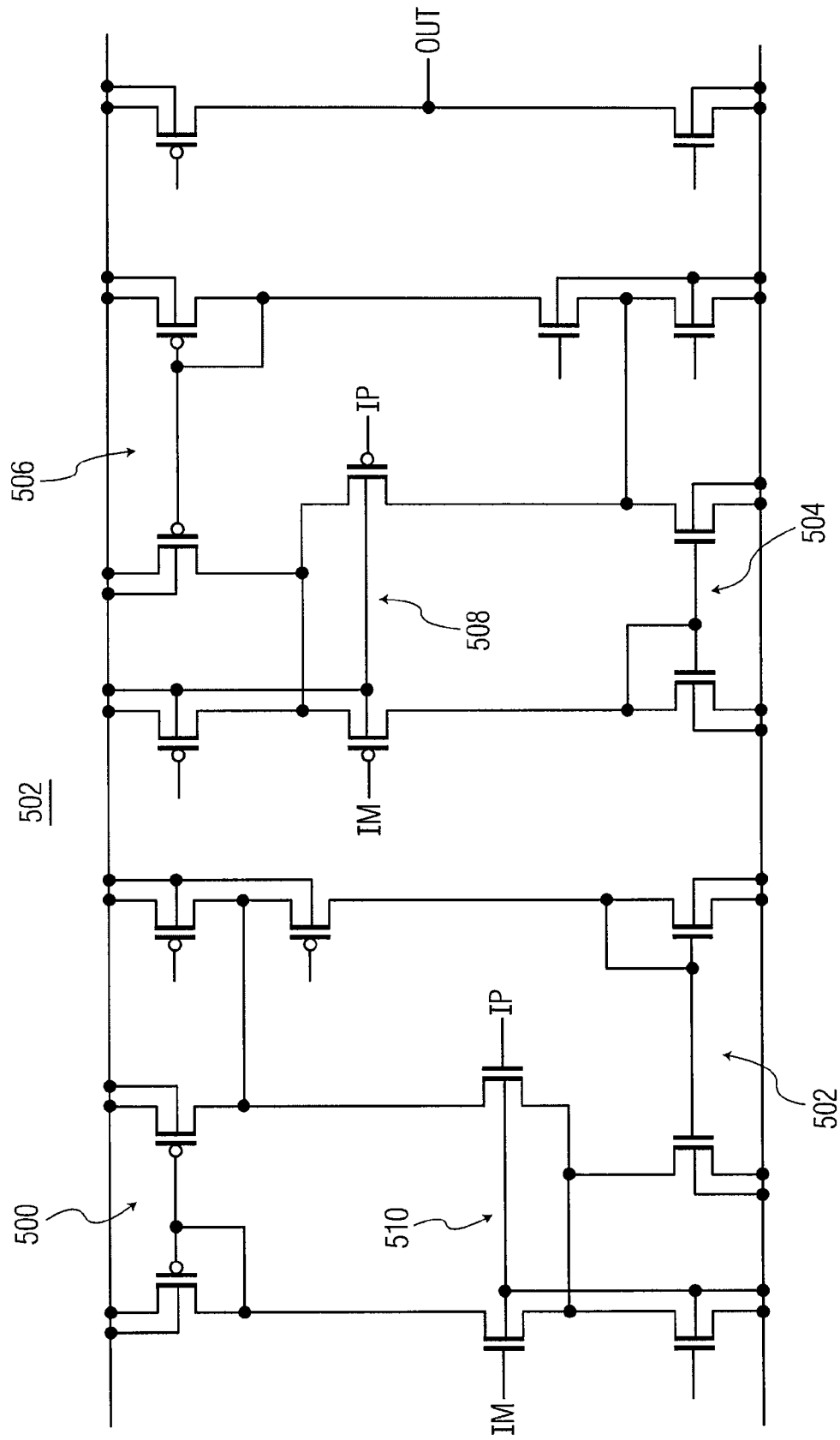
FIG. 4 is a schematic diagram of a class AB operational transconductance amplifier (OTA).

An exemplary implementation of buffer 414 for the imagers shown in FIGS. 3 and 5 utilizes amplifier 520 shown in FIG. 4. Amplifier 520 is a class AB single stage operational transconductance amplifier (OTA). As shown, OTA 520 includes current mirrors 500, 502, 504, 506 and differential amplifiers 508, 510. In one example, OTA 520 may be configured to implement buffer 414 shown in FIG. 3. For example, node OUT of OTA 520 may be output node 442 of buffer 414 of FIG. 3. IM of OTA 520 may be coupled to output node 442 for negative feedback. Furthermore, IP of OTA 520 may be connected to capacitor 416 and switch 418 via input node 440 of FIG. 3. This configuration allows OTA 520 to behave as a buffer suitable for the imager circuit shown in FIG. 3.

Figure 6:
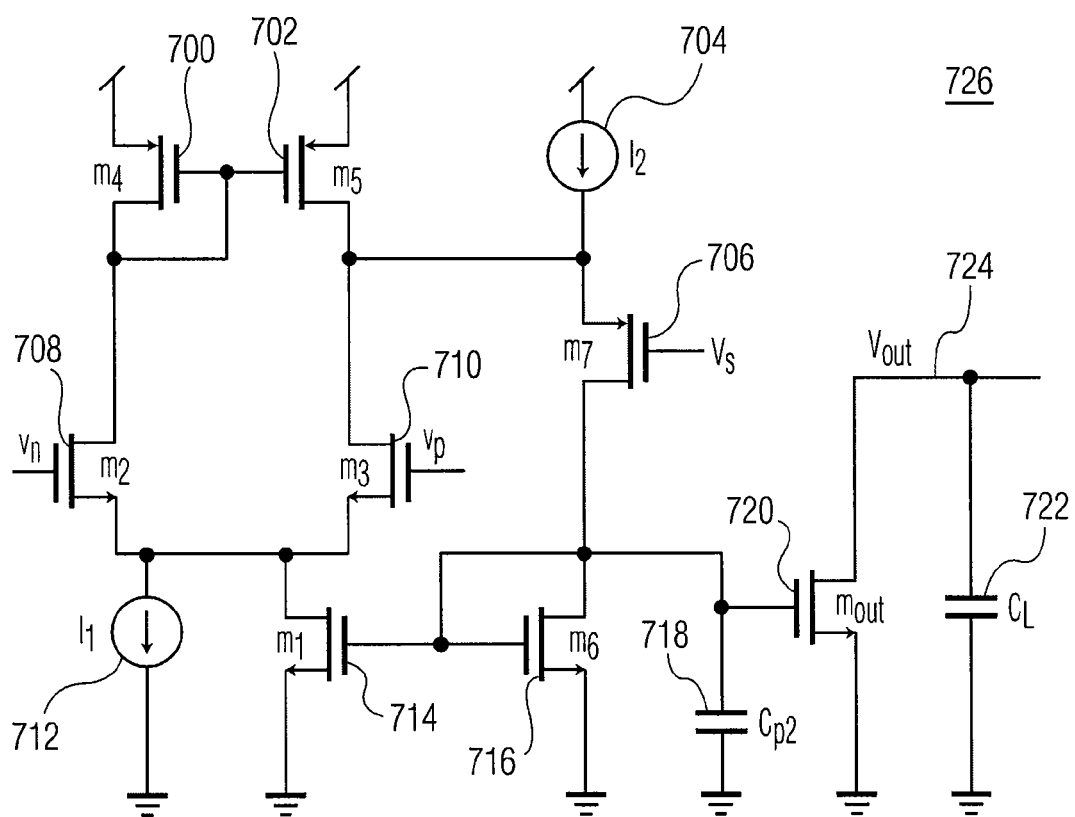
FIG. 6 is a schematic diagram of a class AB single stage amplifier.

The operation of OTA 520 may be better understood by referring to a simplified diagram of amplifier 726 shown in FIG. 6, where only the NMOS input stage is shown. Amplifier 726 includes transistors 700, 702, 706, 708, 710, 714, 716, 720, current sources 704 and 712 and capacitors 718 and 722. Transistors 708 and 710 are a differential pair for receiving input signals Vn and Vp. Transistor pairs 714-716 and 716-720 are current mirrors. The class AB behavior of amplifier 726 is a result of less than unity positive feedback of the output current via transistors 714 and 716. Furthermore, this current is mirrored to the output 724 via transistor 720.

Amplifier 726 may be approximated by a two pole system. In order to maintain stability and provide an adequate settling time for amplifier 726, the second pole may be set 2-3 times higher in frequency than the unity gain frequency of the amplifier. The second pole of the system may be calculated as a ratio of the transconductance of transistor 716 to the capacitance of capacitor 718. Capacitor 718 is largely due to the gate-source capacitance of transistor 720, the latter being the output transistor of amplifier 726. The unity gain frequency may be calculated as a ratio between the total transconductance of amplifier 726 and the capacitance of capacitive load 722. Next, the total transconductance of amplifier 726 may be approximated by multiplying the transconductance of transistors 708 and 710 by the size ratio between transistors 716 and 720.

Because of the dependency on the output current mirror produced by transistors 716 and 720, the transconductance of amplifier 726 and the capacitive value of capacitor 718 scale almost linearly with the size of output transistor 720. Thus, when the capacitive load varies, which also varies the unity gain frequency, scaling the size of output transistor 720 advantageously maintains a proper ratio between the second pole and the unity gain frequency to ensure system stability and good settling time.

Figure 9:
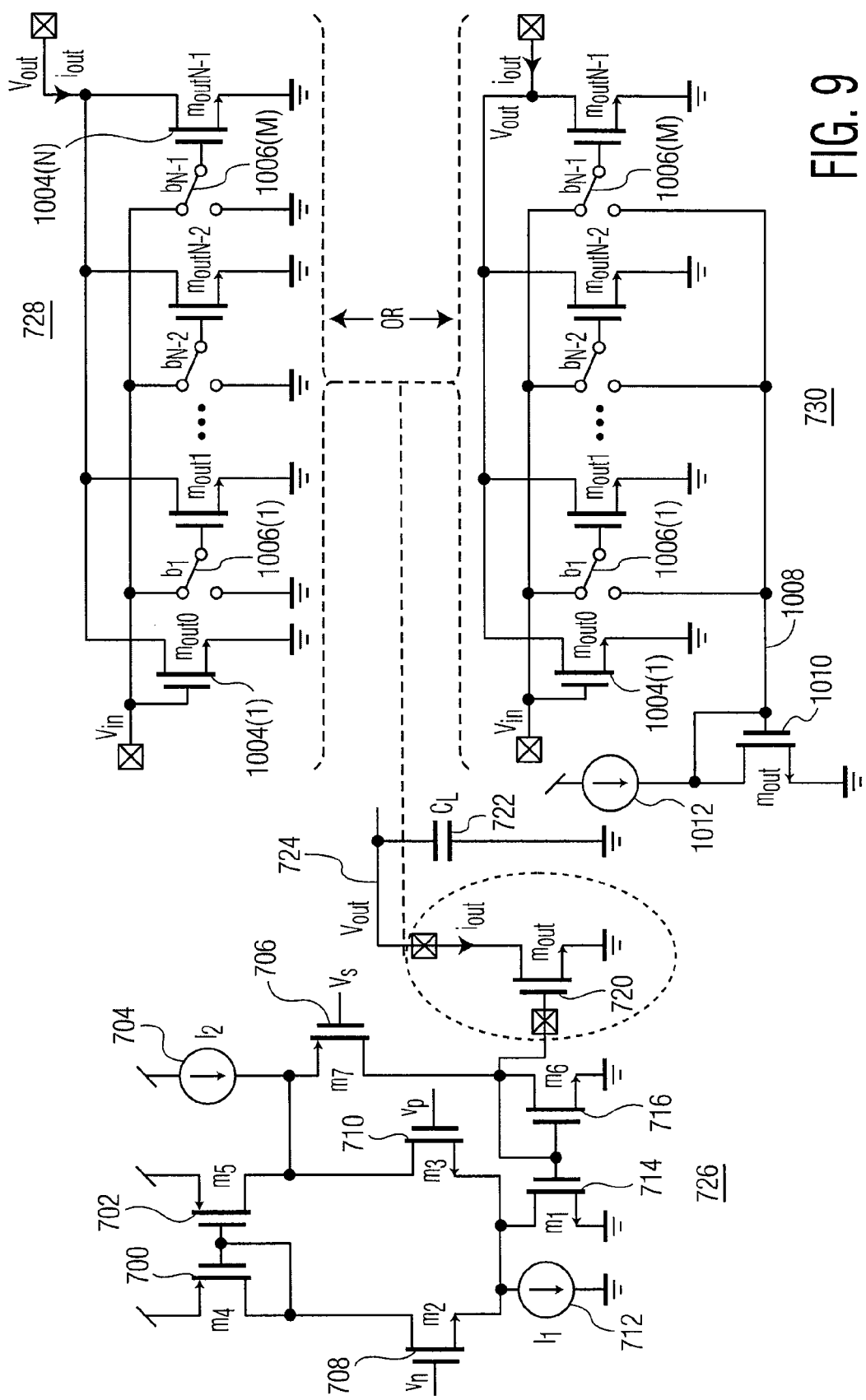
FIG. 9 is a schematic diagram of a class AB single stage amplifier having multiple output transistors, which are selectively on/off, in accordance with an embodiment of the present invention.

FIG. 9 shows two examples of how the size of output transistor 720 may be scaled by splitting output transistor 720 into multiple (for example N) parts. More specifically, each of the N parts includes a transistor and a single pole double throw switch. In the first example, output transistor 720 may be replaced by circuit 728 having transistors 1004(1)-1004(N) and switches 1006(1)-1006(M). Note that the value of M is one less than the value of N. All the transistors in circuit 728 share a common ground node and a common Vout node. Each switch may be controlled independently to connect a gate of a respective transistor to either a ground reference or a Vin reference.

In operation, the transistors of circuit 728 may be in one of two states depending on the position of the switches. In general, if a switch connected to a respective gate of a transistor is connected to the input terminal Vin, the transistor is on and conducting, thus increasing the size of the output stage. If the switch, however, is connected to a ground reference, the transistor is off and not conducting, thus not affecting the size of the output stage. It will be noted that the size of the output stage is directly dependent on the number of conducting transistors. Accordingly, the size of output transistor 720 may be scaled larger or smaller by connecting a predetermined number of transistors to either the Vin or the ground reference, respectively.

Settling time of the amplifier may be improved by holding the gates of the output transistors at a voltage other than ground. FIG. 9, in the second example, shows circuit 730 providing this improved settling time. As shown, the gates of the N transistors are connected, by way of the switches, to a voltage potential greater than a ground reference. More specifically, the switches connect the gates of the N transistors to node 1008, which is disposed at a potential reference determined by transistor 1010 and current source 1012. This potential reference is higher than the ground reference. Thus, circuit 730 improves settling time, because less time is required to charge a gate of a respective transistor and turn on that transistor.

Figure 10:
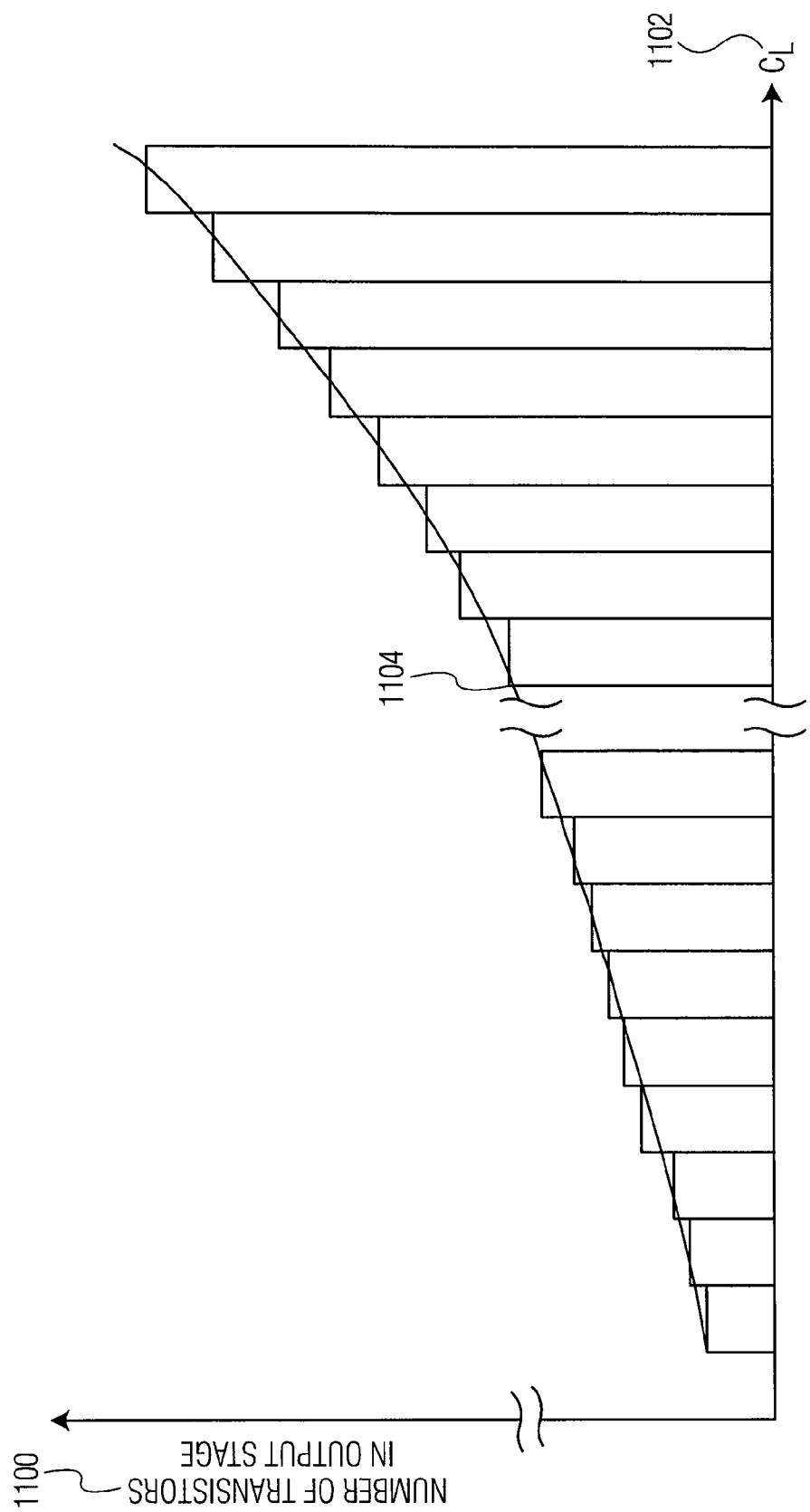
FIG. 10 is a plot of the number of transistors selectively turned on in the output stage of the amplifier shown in FIG. 9 versus the size of the capacitive load shown in FIG. 8, in accordance with an embodiment of the present invention.

By dividing the output transistor 720 into N separate transistors, the present invention is advantageously effective in scaling the size of the output stage of buffer 726 in response to a varying capacitive load, such as load capacitor 722. This provides stability and short settling time for buffer 726. The relationship between the number of output transistors connected in the output stage of buffer 726 and the size of the capacitive load is shown in FIG. 10. As shown, the number of transistors connected in the output stage increases with an increase in capacitive load.

Returning now to FIG. 1, a voltage reference Vref is buffered by buffer 104 and applied to varying capacitive load 120. In the exemplary embodiments of the present invention described above, buffer 104 may be exemplified by amplifier 726 with the output stage of either circuit 728 or circuit 730 shown in FIG. 9. More specifically, the reference voltage Vref is applied to the positive terminal Vp of transistor 710, and the negative terminal Vn of transistor 708 is connected to output terminal 724 (which is the same output node 110 in FIG. 1). This type of buffer is a voltage follower circuit having a unity gain.

In order to compensate for a varying capacitive load, the present invention first determines the number of capacitors connected to output node 110 of buffer 106. Once the number of capacitors in output load 120 is determined, the size of the buffer output stage may be fixed by connecting a predetermined number of output transistors to output node 110. The manner in which this operation may be performed is described below.

Figure 7:
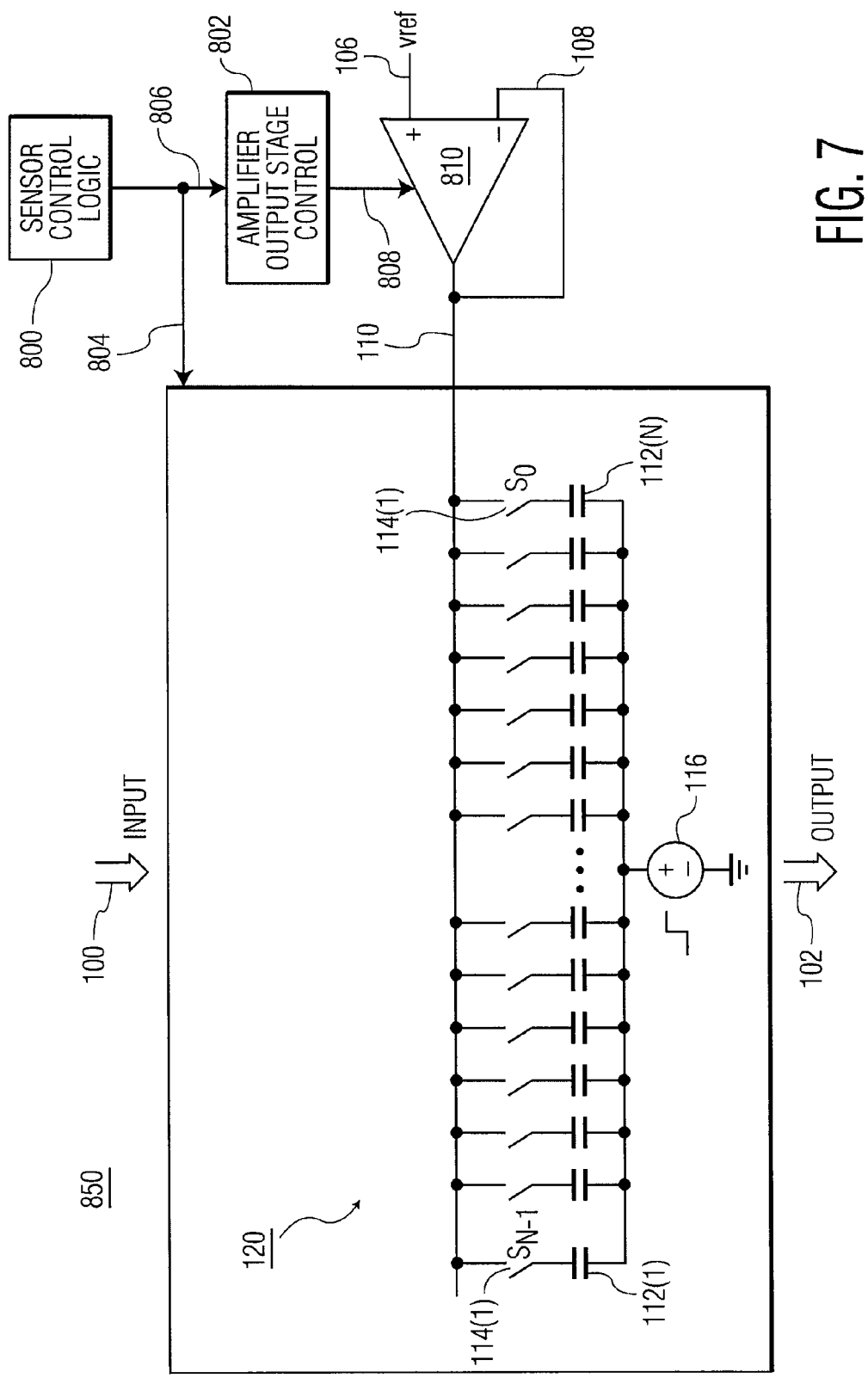
FIG. 7 is a schematic diagram of a buffer supplying a voltage reference to a variable capacitive load, in accordance with an embodiment of the present invention.

In a first embodiment, shown in FIG. 7, the capacitive load compensation system of the present invention, designated as 850, includes input terminal 100, output terminal 102, and varying capacitive load 120 comprised of respective switches 114(1)-114(N) in series with respective capacitors 112(1)-112(N). Also included are sensor control logic 800, amplifier output stage controller 802 and buffer 810. The buffer provides a buffered voltage reference signal (approximately Vref) at output node 110, based on the Vref reference signal at input node 106.

In this first embodiment, the capacitive load of system 850 is independent of the signals at input terminal 100 and output terminal 102. Thus, the switches controlling the size of the capacitive load are controlled, in turn, by sensor control logic 800 via path 804. When sensor control logic 800 sets a desired value for capacitive load 120, a number of switches in the bank of switches 114(1)-114(N) are closed to provide the desired value.

In order for buffer 810 to compensate for the varying capacitive load, amplifier output stage controller 802 requires knowledge of the value of the load. Therefore, as sensor control logic 800 controls load 120, via path 804, it also informs amplifier output stage controller 802 of the same. In turn, amplifier output stage controller 802 controls the N switches of output stage amplifier 728 or 730 (FIG. 9) of buffer 810. In this manner, although capacitive load 120 may vary greatly, system 850 of the present invention maintains a nearly constant reference voltage at output node 110 and yet remains stable and settles quickly.

Figure 8:
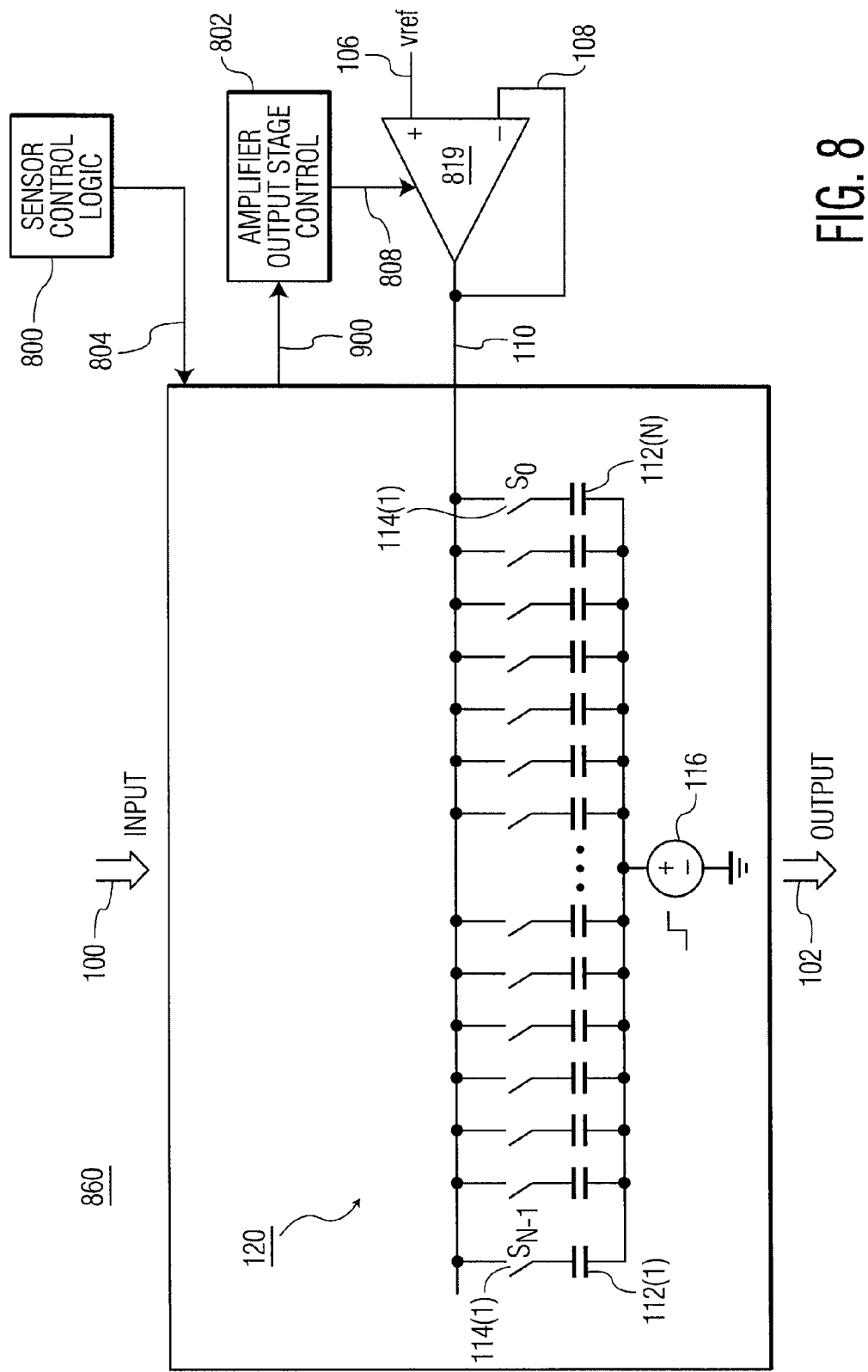
FIG. 8 is a schematic diagram of a buffer supplying a reference voltage to a variable capacitive load, in accordance with another embodiment of the present invention.

In a second embodiment, shown in FIG. 8, the present invention of system 860 includes similar components to that of system 850. The amplifier output stage controller 802, however, is not controlled by sensor control logic 800. As shown in FIG. 8, capacitive load 120 is controlled by sensor control logic 800, as in the first embodiment. Instead, capacitive load 120 varies as a function of the input and output signals at input and output terminals 100, 102, respectively. Due to this dependency, amplifier output stage controller 802 cannot depend on control logic 800 to determine the capacitive load of the bank of capacitors 120. Therefore, amplifier output stage control 802 is configured to sense the state of switches 114(1)-114(N) via path 900 in order to correctly control buffer 810. This exemplary embodiment may be used in other situations in which the capacitive load is varies in an unpredictable manner, as in the capacitive load of the ADC shown in FIG. 5.

Figure 11:
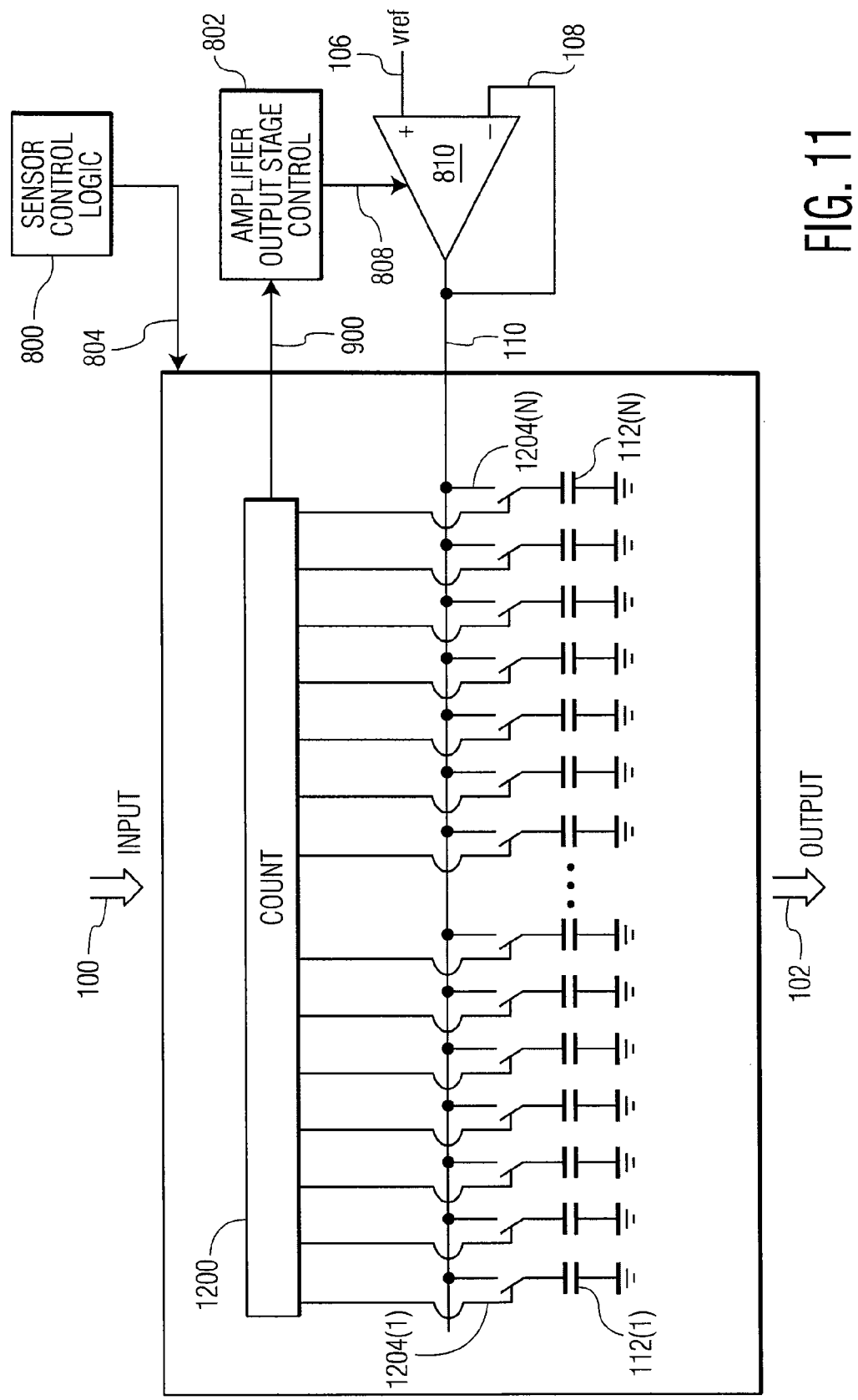
FIG. 11 is a functional block diagram of a buffer supplying a reference voltage to the variable capacitive load of FIG. 8, including a counter for determining the number of capacitors in a capacitive load, in accordance with an embodiment of the present invention.

A load sensor is thus used by the present invention to sense the size of the varying capacitive load. This information is relayed to amplifier output stage controller 802, which, in turn, relays the same information to buffer 810. One embodiment of the load sensor is shown in FIG. 11. Specifically, the load sensor includes count circuit 1200 for counting the number of the switches 1204(1)-1204(N) that are closed or opened. The resultant switch count is then relayed via path 900 to amplifier output stage controller 802. Amplifier output stage controller 802 uses the count information to determine how many transistors in the amplifier output stage of circuit 728 or 730 (FIG. 9) to connect to output node 110 of buffer 810 (FIG. 11). In some embodiments of the invention, an exact count may be provided and in other embodiments an approximate count may be sufficient.

Figure 12A:
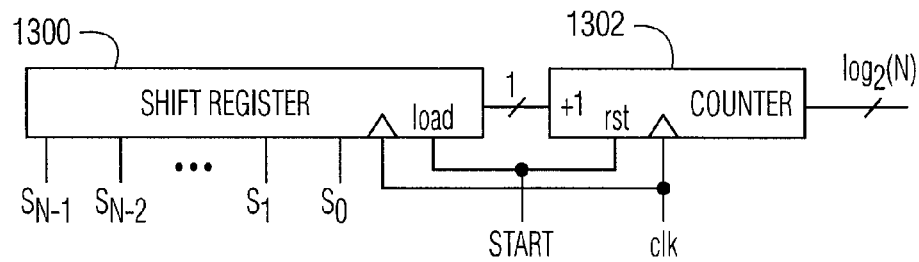
FIG. 12 is a functional block diagram of the counter shown in FIG. 11, in accordance with an embodiment of the present invention.
Figure 12B:
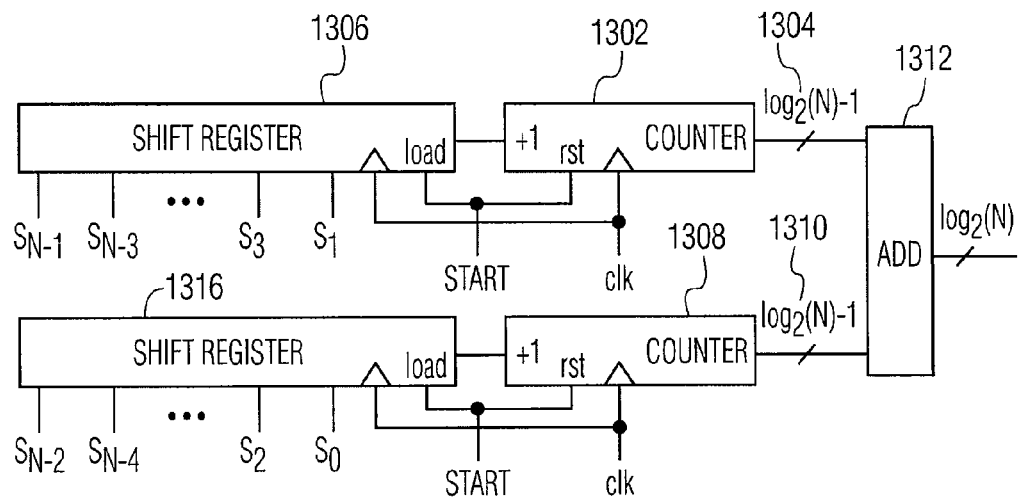
Figure 12C:
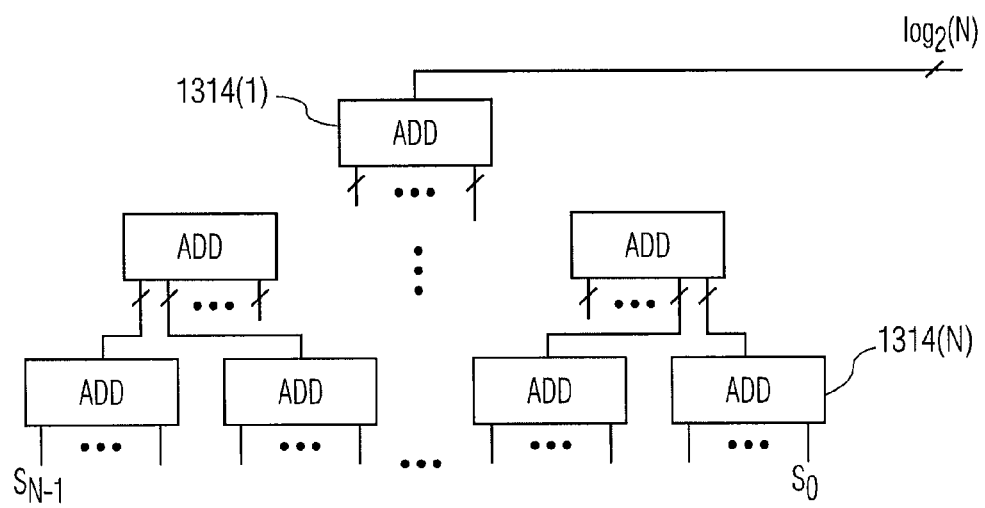

The count circuit 1200 may be implemented in the digital domain or analog domain. For example, FIG. 12 shows three digital implementations of count circuit 1200, designated A, B and C. As shown in implementation A, the state of each switch $S_{n-1}$ to $S_0$ (FIG. 7) is stored in shift register 1300 and shifted out by up-counter 1302. Implementation A has a serial output and may, therefore, be slow, if there is a large number of switches in the capacitive load.

Implementation B shows a faster alternative which utilizes multiple shift registers operating in parallel to reduce the time required to shift out all the data. Specifically, shift registers 1306 and 1316 operate in parallel with respective counters 1302 and 1308. Their count outputs are then added together by adder 1312. The more shift registers operating in parallel, the faster the count output is computed. It should be noted however, that more shift registers requires more hardware.

Implementation C is an example of a counter that does not require shift registers. In addition, implementation C provides a faster computation speed than implementation A or B. In operation, the switch state values of $S_{n-1}$ to $S_0$ are directly inputted to a tree of adders 1314(1)-1314(N). This allows the counter to immediately begin summation in a parallel manner, without the need to wait for shift registers to shift out a serial output count.

Figure 13:
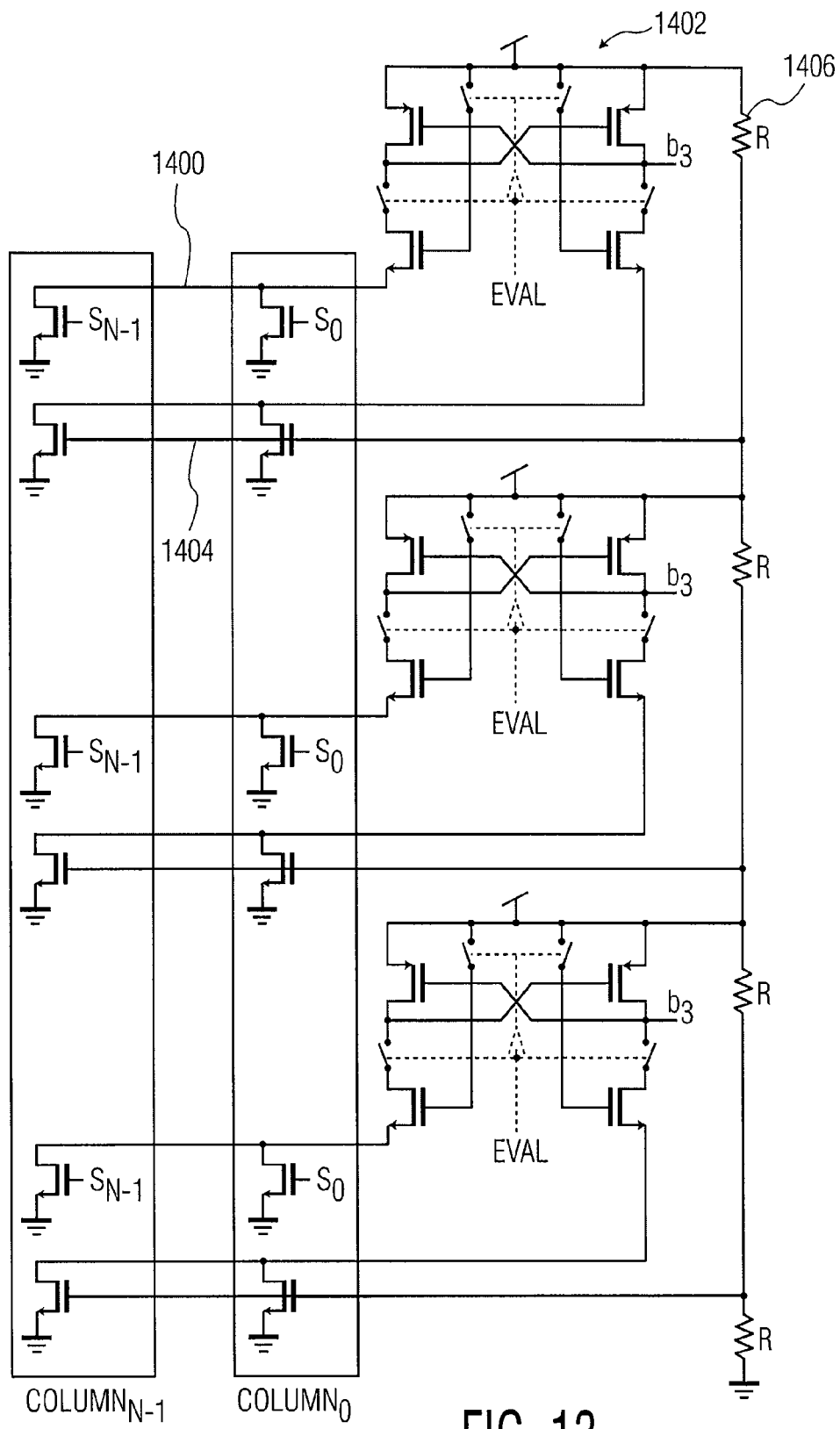
FIG. 13 is a schematic diagram of the counter shown in FIG. 11, in accordance with another embodiment of the present invention.

One drawback to the digital implementation of count circuit 1200 is that it uses many hardware gates. If a crude estimate of the capacitive load is sufficient, an analog implementation provides a more efficient approach. This approach, shown in FIG. 13, converts a vector of the switch state values of $S_{n-1}$ to $S_0$ into an analog signal and then the analog signal is converted into a low resolution binary signal (a 2-bit analog signal).

Specifically, transistor array 1400 acts as a digital to analog converter (DAC) which converts the states of the digital switches into an equivalent analog signal. For example, the digital on/off states of the transistors in array 1400 translate into an equivalent analog signal. A reference analog signal is also produced by resistor ladder 1406 and transistor array 1404. Both the converted analog signal and reference analog signal are then compared with one another to determine the output state of latch 1402. Depending on this comparison, output b3 of latch 1402 is set low or high. In this example, the analog signal representation of the states of the digital switches is compared to three reference levels which are generated by the resistor ladder producing a quantized 2-bit digital signal. In this 2-bit implementation, four possible latch outputs are (b1=0 b2=0 b3=0), (b1=1 b2=0 b3=0), (b1=1 b2=1 b3=0) and (b1=1 b2=1 b3=1). The large number of bits that represented the digital switch states of the capacitive load have thus been reduced to a representation of only 2-bits of resolution. This implementation requires less hardware and may be sufficient depending on the needs of the system.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. In an image sensor, a buffer for setting a reference voltage on a common plate of a plurality of capacitors, the buffer comprising
input and output nodes,
a reference voltage provided at the input node and buffered to the output node, and
a plurality of transistors selectively connected in parallel at the output node,
wherein the common plate of the plurality of capacitors is connected to the output node, and
a first number of transistors of the plurality of transistors selectively connected in parallel increases as a second number of capacitors of the plurality of capacitors connected to the output node increases.

2. The buffer of claim 1 wherein
a counter is configured to determine the second number of capacitors connected to the output node, and
a controller, in response to the second number provided by the counter, is configured to connect the first number of transistors to the output node.

3. The buffer of claim 1 wherein
the first and second numbers are each greater than two.

4. The buffer of claim 1 including
a differential amplifier having positive and negative input terminals, and
the differential amplifier coupled to the plurality of transistors,
wherein the positive input terminal and the input node are the same, and the negative input terminal is connected to the output node.

5. The buffer of claim 1 wherein
the buffer is a VCL buffer used to set the voltage reference of the common plate of the plurality of capacitors in a programmable gain amplifier (PGA) during sampling, pixel readout and analog-to-digital conversion of an image signal from an image array of the image sensor.

6. A method of maintaining a reference voltage at a common node of a plurality of capacitors, the method comprising the steps of:
selectively connecting the plurality of capacitors in parallel for varying a capacitive load between input and output signals;
buffering the reference voltage between input and output nodes of a buffer, the buffer including a plurality of output transistors;
connecting the output node of the buffer to the common node of the plurality of capacitors; and
selectively connecting the plurality of output transistors to the common node based on the plurality of capacitors selectively connected between the input and output signals;
wherein a number of the output transistors connected to the common node increases when a number of capacitors connected between the input and output signals increases.

7. The method of claim 6 wherein
the common node of the capacitors is a common plate of the capacitors, and
the buffer includes a unity gain.

8. The method of claim 6 including the steps of:
counting the number of capacitors connected between the input and output signals; and
varying the number of output transistors connected to the common node.

* * * * *